(12) United States Patent
Van Vuuren et al.

(10) Patent No.: US 8,790,441 B2
(45) Date of Patent: Jul. 29, 2014

(54) TITANIUM POWDER PRODUCTION PROCESS

(75) Inventors: David Steyn Van Vuuren, Pretoria (ZA); Salomon Johannes Oosthuizen, Pretoria (ZA)

(73) Assignee: CSIR, Pretoria (ZA)

( * ) Notice: Subject to any disclaimer, the term of this patent is extended or adjusted under 35 U.S.C. 154(b) by 41 days.

(21) Appl. No.: 13/336,333

(22) Filed: Dec. 23, 2011

(65) Prior Publication Data

US 2013/0000449 A1   Jan. 3, 2013

Related U.S. Application Data

(63) Continuation of application No. PCT/ZA2011/000010, filed on Feb. 23, 2011.

(30) Foreign Application Priority Data

Feb. 25, 2010 (ZA) .................................. 2010/1360

(51) Int. Cl.
  *B22F 9/18* (2006.01)
(52) U.S. Cl.
  CPC ............. *B22F 9/18* (2013.01); *B22F 2301/205* (2013.01)
  USPC .................................. 75/368; 75/619; 75/620
(58) Field of Classification Search
  None
  See application file for complete search history.

(56) References Cited

U.S. PATENT DOCUMENTS

| 2,839,385 A | 12/1954 | Olson |
| 2,846,303 A | 8/1958 | Keller et al. |
| 4,521,281 A * | 6/1985 | Kadija ........................ 205/398 |

(Continued)

FOREIGN PATENT DOCUMENTS

JP    58009948 A   *   1/1983

OTHER PUBLICATIONS

Suzuki, et al., "Titanium Power Prepared by Magnesiothermic Reduction of $T^{2+}$ in Molten Salt", Metallurgical and Materials Transactions B, vol. 30B, Jun. 1999, pp. 403-410.

(Continued)

*Primary Examiner* — George Wyszomierski
(74) *Attorney, Agent, or Firm* — Cesari and McKenna, LLP (57) ABSTRACT

The invention provides a crystalline Ti powder produced in a molten salt medium, said powder comprising predominantly particles of single α-Ti crystals that are directly applicable in powder metallurgy. The invention extends to continuous process for the production of titanium powder in a molten salt medium by known reaction mechanisms, said process including the steps of reacting in a first reaction zone in a molten salt TiCl4 with reactants selected from Ti particles, a substoichiometric quantity of reducing agent, and a mixture of titanium metal and a substoichiometric amount of reducing agent, to form Ti sub-chloride, transferring Ti sub-chloride containing salts from the first reaction zone into a second reaction zone, which is electrically, ionically, or both electrically and ionically isolated from the first reaction zone, reacting in the second reaction zone the Ti sub-chloride with molten reducing metal to form dispersed Ti powder and molten salt, and withdrawing a portion of a suspension of Ti powder in molten salt from the second reaction zone to downstream processing units to separate the Ti powder from the salt and optionally recycle a portion of said Ti powder in molten salt to the first reaction zone. The invention further extends to an apparatus for the process of the invention.

12 Claims, 5 Drawing Sheets

(56) References Cited

U.S. PATENT DOCUMENTS

| | | | |
|---|---|---|---|
| 5,259,862 A | | 11/1993 | White et al. |
| 6,117,208 A | * | 9/2000 | Sharma .......................... 75/613 |
| 6,210,461 B1 | | 4/2001 | Elliott |
| 2008/0307925 A1 | * | 12/2008 | Wellwood et al. .............. 75/357 |

OTHER PUBLICATIONS

Oi, et al., "Fundamental Study on Titanium Production Process by the Disproportion Reactions of Titanium Subchlorides", Department of Materials Engineering, the University of Tokyo, 2007, pp. 111-114.

Elliott, "The Continuous Production of Titanium Powder Using Circulating Molten Salt", JOM, Sep. 1998, pp. 48-49.

Naito, et al., "Reduction of $TiCl_4$ Gas by Ca Dissolved in Molten Calcium Chloride," Dept. Energy Sco, & Techn., Kyoto University, 2007, pp. 103-106.

Okabe, et al., "Metallothermic Reduction as an Electronically Medicated Reaction," Journal of Materials Research, vol. 13, No. 12, Dec. 1998, pp. 3372-3377.

Fuwa, et al., "Producing Titanium by Reducing $TiCl_2$-$MgCl_2$ Mixed Salt with Magnesium in the Molten State," JOM vol. 57(10), Oct. 2005, pp. 56-60.

* cited by examiner

TITANIUM POWDER PRODUCTION PROCESS

CROSS REFERENCE TO RELATED APPLICATIONS

Under 35 USC 120, this application is a continuation of International Application No. PCT/ZA2011/000010, filed Feb. 23, 2011. Under 35 USC 119, this application claims the benefit of the priority date of South African Application No. 2010/1360, filed Feb. 25, 2010. Both of the foregoing applications are incorporated herein by reference.

FIELD OF THE INVENTION

The invention relates to the production of titanium powder in a molten salt medium.

BACKGROUND TO THE INVENTION

A viable process to produce titanium powder entails the following overall reaction:

$$TiCl_4 + 2mM = Ti + 2mMCl_{2/m}$$

wherein,

M is a reducing agent selected from an alkali metal or alkaline earth metal, for example, Li, Na, K, Be, Mg, Ca, and the like, however, in practice M is typically selected from the group Li, Na, Mg, and Ca; and m=1 when M is an alkaline earth metal and 2 when M is an alkali metal.

This reaction can be performed continuously in a molten salt medium that consists mainly of a halide salt of the reducing agent, typically a chloride salt, which is also a by-product of the reaction.

The titanium thus produced is in the form of powder that is suspended in the molten salt medium. This can be separated from the molten salt by a number of different known technologies such as filtration, sedimentation, leaching or evaporation or any combination of these technologies. After separation, the salt can be recovered and electrolyzed by conventional means to regenerate the reducing agent and chlorine gas, e.g.:

$$MCl_{2/m} = M + 1/mCl_2$$

The reactor or reactors in which the reaction is performed is made of a suitable metal, preferably a low-alloy steel vessel.

A major problem experienced with the process is that the $TiCl_4$ is reduced so rapidly that it forms lumps of titanium powder that blocks the line through which the $TiCl_4$ enters the reactor vessel and it also forms lumps of fine agglomerated titanium particles that adhere to the reactor wall and reactor internals such as baffles and stirrers.

It is believed that this rapid reaction occurs via electrochemical reactions which allow the $TiCl_4$ and subsequent titanium sub-chlorides to react with the reducing agent even if there is no physical contact between the titanium chlorides and the reducing agent. This process is sometimes referred to as long range electronically mediated reduction (LR-EMR).

The major electrochemical reactions that occur are:
Anodic Reactions:

$$M = M^{n+} + ne^-$$

$$TiCl_2 + Cl^- = TiCl_3 + e-$$

Cathodic Reactions:

$$TiCl_4 + e = TiCl_3 + Cl^-$$

$$TiCl_3 + e = TiCl_2 + Cl^-$$

$$TiCl_2 + 2e^- = Ti + 2Cl^-$$

The electrons that are formed via any one of the anodic reactions are conducted along all or any of the metal parts of the reactor and wherever gaseous $TiCl_4$ or any dissolved titanium chloride species are in simultaneous contact with such metal parts and the molten salt reaction medium, it is reduced with the electrons. The reducing metal cations and chloride anions that are formed as a result of these reactions neutralize each other via the salt bridge formed by the molten salt medium in the reactor.

It has been proposed to do the reduction of $TiCl_4$ in two batchwise stages in a single alumina crucible reactor. In the first stage $TiCl_4$ is reduced with metallic Ti to a titanium sub-chloride ($TiCl_3$ or $TiCl_2$, preferably $TiCl_2$) and in the second stage, the sub-chloride is reduced with a reducing metal to metallic titanium powder. Part of the metallic titanium produced in the second step is recycled to the first step and the rest is withdrawn as product.

The two stage process was demonstrated on a laboratory scale by doing the first step, batch wise in an alumina crucible and feeding the $TiCl_4$ into the alumina crucible via an alumina or a magnesium oxide tube and thereafter, carrying out the second step batch wise in the alumina crucible by adding magnesium to $TiCl_2$ containing molten $MgCl_2$.

By doing the experiments in an alumina crucible, the electrical current path was essentially broken and by doing the experiments batch-wise in two stages and at different times, the molten salt bridge between the magnesium (or reducing metal) and the $TiCl_4$ feed line was broken.

However, when using an alumina lined reaction vessel with some of the more reactive reducing agents, alumina reacts with the reducing agent and it is virtually impossible to produce titanium meeting the industrially required oxygen specification because the alumina is too reactive. The only oxides that can be used that are sufficiently inactive to the relevant reducing agents noted are calcium, scandium and yttrium oxide. Unfortunately these oxides are too inconvenient or expensive to use as lining material. Furthermore, batch-wise production of titanium powder would be more expensive than continuous production.

Thus, having considered the above technical problems in the production of titanium powder the inventors now propose the following invention.

SUMMARY OF THE INVENTION

The inventors propose that to overcome the problems of the formation of feed line blockages as well as excessive oxygen contamination of the titanium powder product, the reduction should be performed in a continuous process in two or more stages in a series of reactors made of a steel or other metal normally used in industry, the reactors of the different stages being electrically isolated from each other.

The electrical isolation may be achieved through the inhibition of contact between electrically conductive materials of construction of the reactors, reactor contents, supports, feed lines, product lines, and the like. Further, molten salt in any two of the reactors may not come into physical contact with the molten salt of any of the other reactors.

Thus, according to a first aspect of the invention, there is provided a continuous process for the production of titanium powder in a molten salt medium by known reaction mechanisms, said process including the steps of:

reacting in a first reaction zone in a molten salt $TiCl_4$ with reactants fed continuously into the first reaction zone, said reactants selected from Ti particles, a substoichiometric quantity of reducing agent, and a mixture of titanium metal and a substoichiometric amount of reducing agent, to form Ti sub-chloride;

transferring continuously Ti sub-chloride containing salts from the first reaction zone into a second reaction zone, which is electrically, ionically, or both electrically and ionically isolated from the first reaction zone;

reacting in the second reaction zone the Ti sub-chloride with reducing metal to form dispersed Ti powder and molten salt;

withdrawing a portion of a suspension of Ti powder in molten salt from the second reaction zone to downstream processing units to separate the Ti powder from the salt; and optionally, continuously recycle a portion of the suspension of Ti powder in molten salt in the second reactor from the second reactor to the first reactor.

In said process, where the transferred Ti sub-chloride containing salt is in the molten state, dispersing said molten salt which is being transferred between the reaction zones so that the continuous stream of molten salt flowing from the first reaction zone to the second reaction zone and vice-versa is broken up into discontinuous molten salt droplets thereby to break the physical contact between the molten salt in the first and second reaction zones thereby maintaining the electrical and ionic isolation of the two reaction zones.

Alternatively, where the transferred salt is in the solid state, the salt is solidified prior to transfer between the reaction zones thereby breaking the physical contact between the flow of molten salt in the first and second reaction zones and thereby maintaining the ionic isolation of the two reaction zones.

The process may include crystallizing out of the Ti powder so that a crystalline Ti powder is formed in the second reaction zone.

The reaction in the second reaction zone may include reacting Ti sub-chloride with reducing metal to form dispersed Ti powder and molten salt;

The crystallization in the second reaction zone may occur at a temperature of from 600° C. to the $\alpha \rightarrow \beta$ transition temperature of about 882° C. with the result that crystalline $\alpha$-Ti powder is formed that is suitable for direct application in powder metallurgy.

The crystallization residence time may be from 2 to 12 hours.

The crystalline Ti powder may comprise of primarily alpha-titanium crystals.

The alpha-titanium crystals may have a size of below 500 μm, typically between 5 and 350 μm.

The $\alpha$-Ti particles may be predominantly in the form of single crystals with regular shapes with flat surfaces and sharp edges and not agglomerates of finer crystals.

The titanium introduced to the first reactor can be sourced from, for example, industry scrap, processed to sufficiently small particle size for ease of handling.

The process may include more than two reaction zones in which case the various reaction zones are electrically isolated from one another substantially as described for two reaction zones above.

Typically the Ti sub-chloride is predominantly $TiCl_2$.

The reaction zones may be part of a single reaction vessel made of a suitable material or materials to achieve the electrical isolation of the zones.

The reaction zones may however be separate reactor vessels spaced apart to achieve electrical isolation with contact through connecting pipework and accessories being inhibited.

The reactor vessels may be made of steel. Typically a low-alloy steel would be used, but high-chrome steel alloys might also be suitable. 18/8 stainless steel is not desirable when using magnesium, but may be acceptable when using Na or Li as reducing agent. Mo is chemically acceptable, but considered prohibitively expensive.

The dispersion may be achieved by means of a distributor located in a transfer pipe, typically where the transfer pipe enters the reactor vessel.

The distributor may be separate from the transfer pipe but be in flow communication therewith.

According to a second aspect of the invention, there is provided a reaction zone inlet arrangement suitable for continuous operation of the process of the invention, said inlet arrangement including:

coupling means provided on an inlet to the reactor vessel; and an insulating element made of an electrically insulating material is configured to be located between the coupling means on the vessel and the feed line which is to be coupled thereto whereby the coupling means is kept electrically isolated from the feed line.

The coupling means may be a flanged coupling.

The insulating element may be an insulating disc which is interposed between a pair of flanges, the one on the reactor vessel and the other on the feed line to be coupled thereto.

According to a third aspect of the invention, there is provided a crystalline Ti powder produced in a molten salt medium, said powder comprising primarily of alpha-titanium crystals and thus directly applicable in powder metallurgy.

The alpha-titanium crystals may have a size of below 500 μm, typically below 350 μm. The alpha-titanium crystals may have a size of below 250 μm.

DESCRIPTION OF AN EXAMPLE OF THE INVENTION

The invention will now be described, by way of non-limiting example only, with reference to the accompanying diagrammatic drawings and SEM images. In the drawings.

Figure 1:
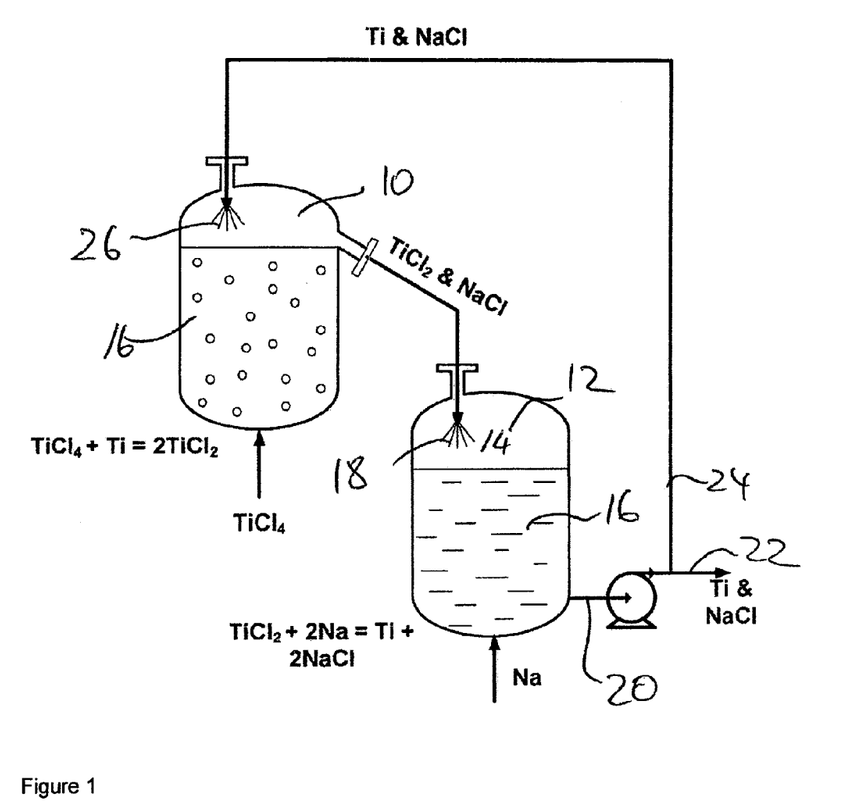
FIG. 1 shows, in schematic representation, a process arrangement of the invention.

In FIG. 1, as shown, in a first reactor 10, $TiCl_4$ reacts with Ti powder that is produced in and recycled from a second reactor 12 to form primarily the Ti sub-chloride $TiCl_2$. The $TiCl_2$ containing molten salt overflows from the first reactor into the second reactor into which it falls through the gas space 14 above the molten salt 16 in the second reactor 12 in such a way that the continuous stream of overflowing salt is broken up 18 (dispersed/sprayed) into discontinuous droplets to break the physical contact between the molten salt in first and second reactors.

The $TiCl_2$ then reacts with molten reducing metal (in the example shown sodium) to form dispersed crystalline Ti powder and molten salt (In the example shown molten NaCl). A portion 22 of the suspension of Ti powder in molten salt 20 is withdrawn from the second reactor and passed to downstream processing units to separate the Ti powder from the salt and part of it is recycled to the first reactor. The recycle stream 24 is also introduced into the first reactor in a way to allow it to form dispersed droplets 26 in order to break the physical contact between the molten salt in the first and second reactors.

Figure 2:
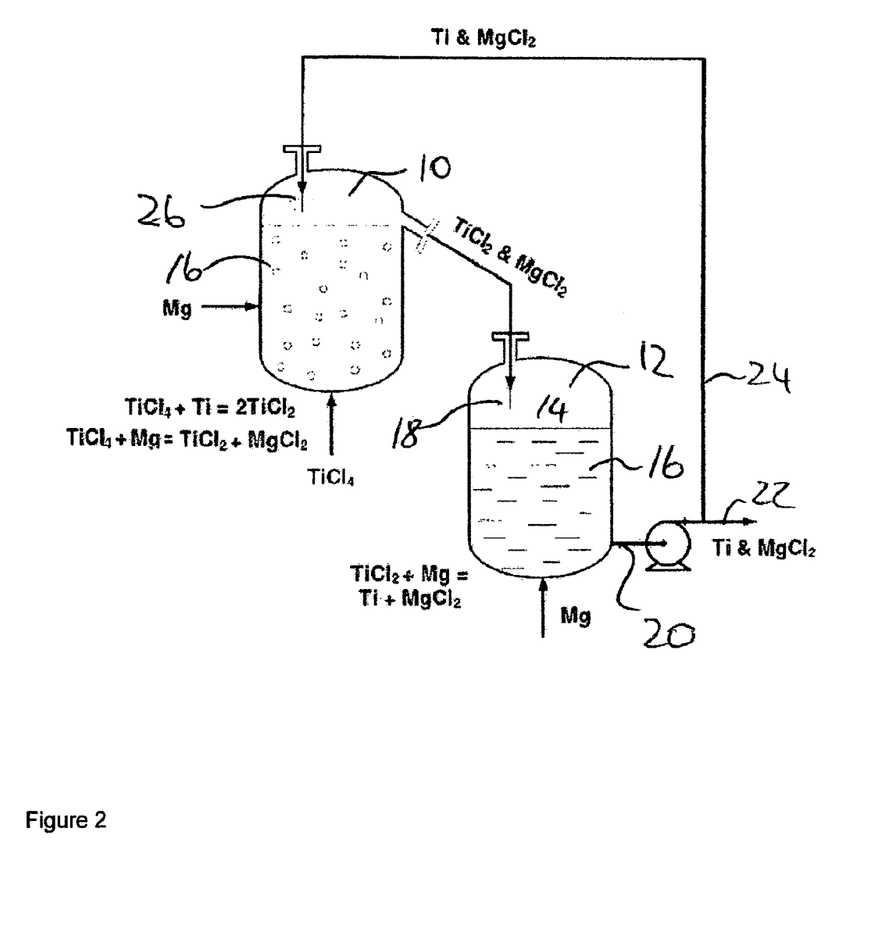
FIG. 2 shows, in schematic representations, another embodiment of the invention.

In the alternative process of FIG. 2, $TiCl_4$ is reacted with a mixture of a sub-stoichiometric quantity of reducing metal, and a recycled stream 24 of titanium powder suspended in molten salt 16, in the first reactor stage 10 to form titanium sub-chloride ($TiCl_2$ or $TiCl_3$) and the reducing metal chloride salt 16. The reductant (in this instance shown as magnesium) is dispersed onto or into the salt, and e.g. by making the size of the reactor large enough, the metallic magnesium is consumed so rapidly that it cannot come into contact with the metallic reactor wall. Consequently no titanium can form in and block the $TiCl_4$ feed inlets and the only titanium that can form, forms in the bulk salt medium in the second reaction zone where Ti sub-chlorides come into contact with more dispersed reducing metal.

The product from the first reactor 10, a suspension of crystalline Ti powder and titanium sub-chlorides in molten chloride salt 16 of the reducing metal, flows to the secondary reactor 12 that is electrically isolated from the first reactor 10. Here the titanium sub-chlorides are brought into contact with a slight excess of reducing metal to ensure that the sub-chloride is converted to crystalline titanium before the crystalline titanium is separated from the chloride salt in downstream processes.

Figure 3:
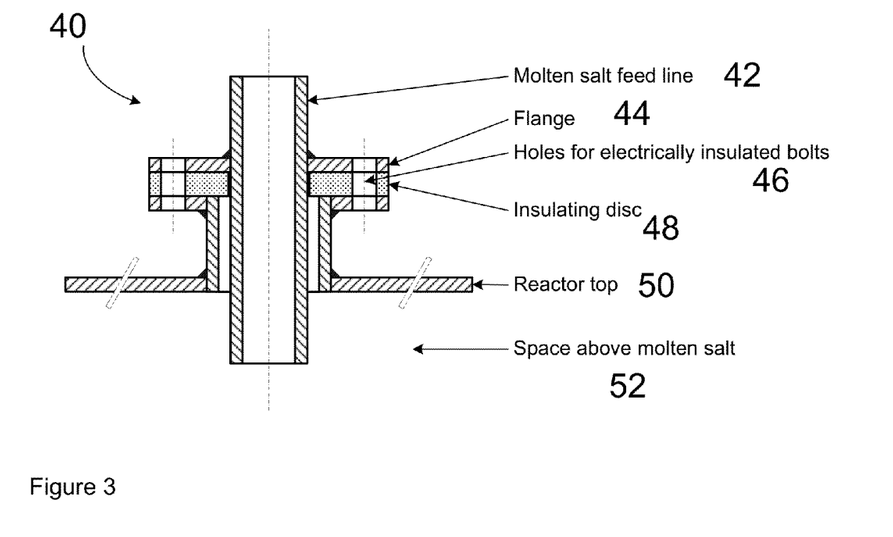
FIG. 3 shows a representation of a coupling arrangement of the invention.

FIG. 3 illustrates the construction of a typical pipe arrangement 40 to allow the molten salt to flow into a reactor. The arrangement ensures that the feed pipe is electrically isolated from the reactor and it also prevents salt from flowing down the sides of the reactor, but to fall down into the molten salt through the gas space in the top of the reactor. The arrangement also ensures that there is no physical contact between the salt and the non-metallic insulating disc. To ensure that the molten salt stream breaks up as it falls down through the gas space, a distributor would typically be installed at the exit point of the salt from the feed pipe to help with spraying or dispersion of the molten salt stream.

In the arrangement 40, a reactor top 50 has a flange onto which a molten salt feed line 42 is bolted by means of a molten salt feed line flange being bolted to the reactor top flange using electrically insulated bolts (not shown) which pass through holes 46 in both of the flanges. An insulating disc 48 is sandwiched between the flanges so that when the molten salt feed line is secured onto the reactor top 50, the feed line 42 is electrically isolated therefrom.

The feed pipe 42 extends into the space 52 above the molten salt in the reactor so that the molten salt mixture can be introduced into the reactor while maintaining the isolation.

Figure 4:
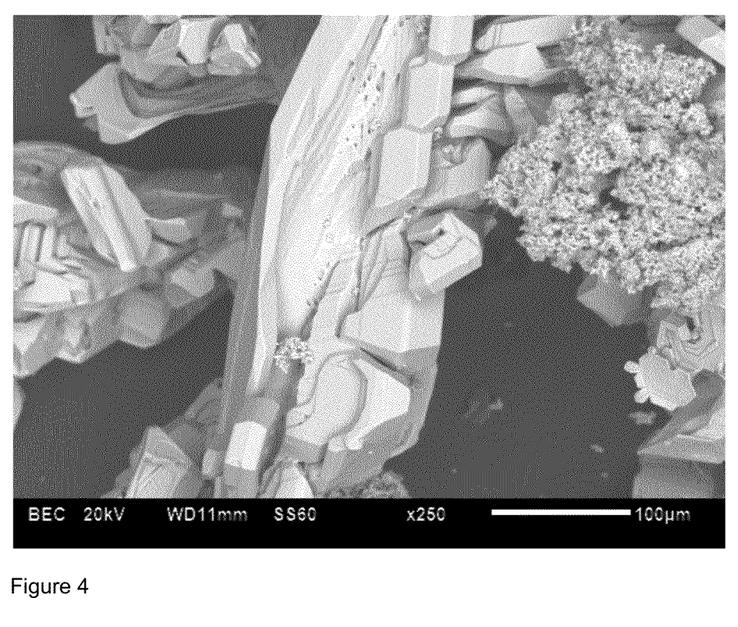
FIG. 4 is an SEM image of a crystalline Ti powder of the invention.
Figure 5:
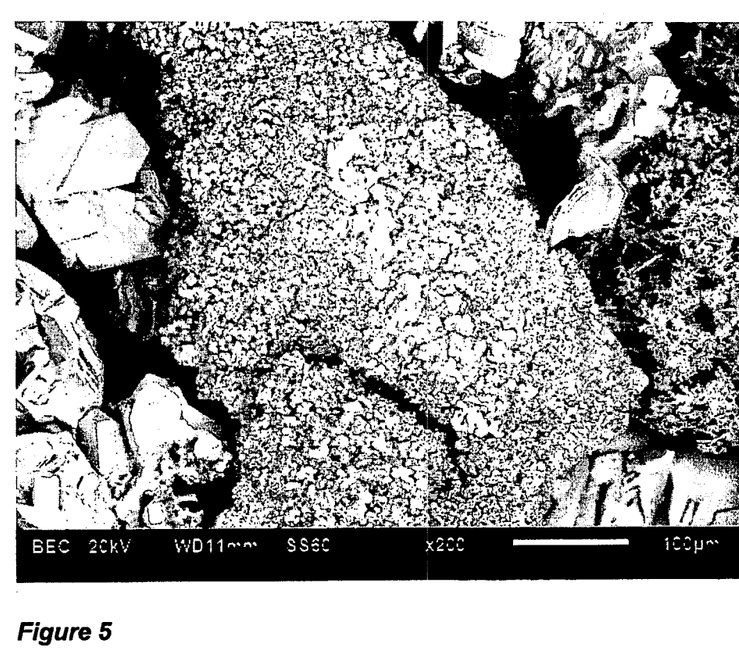
FIG. 5 is an SEM image of Ti crystals and sponge.

FIGS. 4 and 5 show SEM images of the crystalline Ti powder produced in the process. The process of the embodiments produces reactively crystallized Ti powder in a molten salt medium operating in the range 600-882° C. The product is primarily alpha-titanium crystals, as evidenced from the hexagonal shapes, as alpha-titanium takes the form of a Hexagonal Close Packed (HCP) crystal lattice.

Hexagonal Close Packed (HCP) titanium crystal lattice is a three dimensional hexagon, the most efficient, stable, and stress resistant of the metallic crystal structures.

The crystals can be grown to various sizes, with adjustable variables including: residence time, temperature, backmixing, reagent ratios, etc.

There may be backmixing in the α-Ti crystallization reactor, the $2^{nd}$ reactor in FIGS. 1 and 2—from plug flow to complete backmixing as in an ideal continuous flow stirred tank reactor providing a residence time of from 2 to 12 hours, typically between 3 and 8 hours.

The reactant ratio is from a stoichiometric excess of 5% $TiCl_4$ to a stoichiometric excess of reducing metal of 5%, preferably a stoichiometric excess of $TiCl_4$ between 0 and 3%.

In the FIG. 4, the solid structure is a ~250 μm crystal of titanium, with some spongy titanium powder to the immediate right. The reaction mechanisms for the formation of these types of titanium powder differ. It is believed that the crystals are formed through reactive crystallisation in a stirred reactor, whereas the sponge forms via electronically mediated reaction on conductive surfaces such as side-walls and other metal components within the reactor. It is possible to operate the process of the invention in such a way that sponge formation is minimized or even completely eliminated.

FIG. 5 below illustrates the difference between the sponge-like powder (center) and the crystals (surrounding). When completing an elemental scan the sponge like powder, due to surface area and potential for chlorine entrapment, contains much more impurities ($O_2$, $N_2$, Fe, Cr) than the Ti crystals.

As can be seen in FIG. 5 the process of the invention produces a unique powder that is not expected to require additional milling to break sintered/ligamental structures, as in many of the other processes producing titanium powders.

The advantages of the invention as illustrated above include the direct continuous production of crystalline titanium powder using ordinary industrial materials and processes. It is a further expected advantage of the invention that the crystalline titanium powder produced is suitable for direct application in powder metallurgy without the need for prior milling.

The invention claimed is:

1. A continuous process for the production of titanium powder in a molten salt medium, said process including the steps of:
reacting in a first reaction zone in a molten salt $TiCl_4$ with reactants fed continuously into the first reaction zone, said reactants selected from Ti particles, a substoichiometric quantity of reducing agent, and a mixture of titanium metal and a substoichiometric amount of reducing agent, to form Ti sub-chloride in the molten salt;
transferring Ti sub-chloride containing molten salt continuously from the first reaction zone into a second reaction zone, which is electrically, ionically, or both electrically and ionically isolated from the first reaction zone;
reacting in the second reaction zone the Ti sub-chloride with reducing metal to form dispersed Ti powder and molten salt;
withdrawing a portion of a suspension of Ti powder in molten salt in the second reaction zone from the second reaction zone to downstream processing units to separate the Ti powder from the salt; and optionally, continuously recycling a portion of the suspension of Ti powder in molten salt in the second reaction zone from the second reaction zone to the first reaction zone.

2. A process as claimed in claim 1, wherein the process includes crystallizing out the Ti powder so that a crystalline Ti powder is formed in the second reaction zone.

3. A process as claimed in claim 2, wherein the crystallization in the second reaction zone occurs at a temperature of from 600° C. to 882° C. with the result that the crystalline Ti powder formed is in the form of α-Ti.

4. A process as claimed in claim 1, wherein the Ti sub-chloride is predominantly $TiCl_2$.

5. A process as claimed in claim 1, wherein the reaction zones are in one or more reactor vessels made of steel selected from a low-alloy steel, a high-chrome steel alloy, and a Mo steel alloy.

6. A continuous process for the production of titanium powder in a molten salt medium, said process including the steps of:
    reacting in a first reaction zone in a molten salt $TiCl_4$ with reactants fed continuously into the first reaction zone, said reactants selected from Ti particles, a substoichiometric quantity of reducing agent, and a mixture of titanium metal and a substoichiometric amount of reducing agent, to form Ti sub-chloride;
    transferring Ti sub-chloride containing salts continuously from the first reaction zone into a second reaction zone, which is electrically, ionically, or both electrically and ionically isolated from the first reaction zone;
    reacting in the second reaction zone the Ti sub-chloride with reducing metal to form dispersed Ti powder and molten salt;
    withdrawing a portion of a suspension of Ti powder in molten salt in the second reaction zone from the second reaction zone to downstream processing units to separate the Ti powder from the salt; and
    optionally, continuously recycling a portion of the suspension of Ti powder in molten salt in the second reaction zone from the second reaction zone to the first reaction zone,
wherein the Ti sub-chloride containing salt is solidified before being transferred between the reaction zones, thereby preventing physical contact between the Ti sub-chloride containing salt in the first and second reaction zones and maintaining the ionic isolation of the two reaction zones.

7. A process as claimed in claim 6, wherein the process includes crystallizing out the Ti powder so that a crystalline Ti powder is formed in the second reaction zone.

8. A process as claimed in claim 6, wherein the Ti sub-chloride is predominantly $TiCl_2$.

9. A continuous process for the production of titanium powder in a molten salt medium, said process including the steps of:
    reacting in a first reaction zone in a molten salt $TiCl_4$ with reactants fed continuously into the first reaction zone, said reactants selected from Ti particles, a substoichiometric quantity of reducing agent, and a mixture of titanium metal and a substoichiometric amount of reducing agent, to form Ti sub-chloride;
    transferring Ti sub-chloride containing salts continuously from the first reaction zone into a second reaction zone, which is electrically, ionically, or both electrically and ionically isolated from the first reaction zone;
    reacting in the second reaction zone the Ti sub-chloride with reducing metal to form dispersed Ti powder and molten salt;
    withdrawing a portion of a suspension of Ti powder in molten salt in the second reaction zone from the second reaction zone to downstream processing units to separate the Ti powder from the salt; and
    optionally, continuously recycling a portion of the suspension of Ti powder in molten salt in the second reaction zone from the second reaction zone to the first reaction zone,
wherein the Ti sub-chloride containing salt is molten and both the molten Ti sub-chloride containing salt which is being transferred between the reaction zones and the recycled portion of the suspension of Ti powder in molten salt are subjected to dispersion such that the continuous stream of molten Ti sub-chloride containing salt flowing from the first reaction zone to the second reaction zone and the continuously recycled portion of the suspension of Ti powder in molten salt flowing from the second reaction zone to the first reaction zone are broken up into discontinuous molten salt droplets thereby preventing physical contact between the molten salt in the first and second reaction zones and maintaining the ionic isolation of the two reaction zones.

10. A process as claimed in claim 9, wherein the dispersion is achieved by means of a distributor located in a transfer pipe that connects the two reaction zones.

11. A process as claimed in claim 9, wherein the process includes crystallizing out the Ti powder so that a crystalline Ti powder is formed in the second reaction zone.

12. A process as claimed in claim 9, wherein the Ti sub-chloride is predominantly $TiCl_2$.

* * * * *